United States Patent [19]

You et al.

[11] Patent Number: 5,583,818

[45] Date of Patent: Dec. 10, 1996

[54] SELF-REFRESH METHOD AND REFRESH CONTROL CIRCUIT OF A SEMICONDUCTOR MEMORY DEVICE

[75] Inventors: Jei-Hwan You, Suwon; Dong-Soo Jun, Seoul, both of, Rep. of Korea

[73] Assignee: Samsung Electronics Co., Ltd., Suwon, Rep. of Korea

[21] Appl. No.: 358,120

[22] Filed: Dec. 19, 1994

[30] Foreign Application Priority Data

Dec. 18, 1993 [KR] Rep. of Korea ................... 28377/1993

[51] Int. Cl.⁶ ......................................................... G11C 7/00
[52] U.S. Cl. ............................. 365/222; 365/233; 365/236
[58] Field of Search ..................................... 365/222, 233, 365/236

[56] References Cited

U.S. PATENT DOCUMENTS 4,989,183  1/1991  Kumanoya ............................. 365/222
5,467,315  11/1995  Kajimoto ............................... 365/222

*Primary Examiner*—A. Zarabian
*Attorney, Agent, or Firm*—Cushman Darby & Cushman IP Group of Pillsbury Madison & Sutro LLP

[57] ABSTRACT

A self-refresh method and refresh control circuit of a semiconductor memory device, wherein after the self-refresh mode starts, the burst refresh mode is performed prior to the self-refresh mode; or the self-refresh mode is performed immediately after going into the self-refresh mode, and the burst refresh mode is performed at the completion of the self-refresh mode, and then the burst refresh mode is converted to the normal access mode; or the burst refresh mode is performed before and after the self-refresh mode, thereby shortening a refresh regulation time and securing a stable refresh of the memory cells.

20 Claims, 6 Drawing Sheets

SELF-REFRESH METHOD AND REFRESH CONTROL CIRCUIT OF A SEMICONDUCTOR MEMORY DEVICE

BACKGROUND OF THE INVENTION

The present invention relates to semiconductor memory devices, and more particularly to a self-refresh method and refresh control circuit for a semiconductor memory device function.

The refresh operation of memory cells should be continuously performed even in a stand-by mode so as to retain data stored in the memory cell, i.e., that of a Dynamic Random Access Memory (DRAM) device. A self-refresh mode is widely used for DRAMs. The self-refresh mode is of the type adapted to perform the refresh operation of the memory cell with the lapse of a predetermined time after going into an operation stand-by mode, even though a separate control signal is not applied from an external source to the memory device. Once the self-refresh mode starts, it is preferable to perform the refresh operation of all memory cells in order to keep data. Thus, the memory devices employing the self-refresh mode have their own refresh regulation time (i.e. the minimum time required in performing the self-refresh mode). Generally, the time required in refreshing data of all memory cells in the self-refresh mode approximates the time required in accessing data in all memory cells in a normal access mode. Preferably, the more the refresh regulation time approximates the time required in the normal access mode, that is, the shorter the refresh regulation time is, the more advantageous the memory device is, since more time can be assigned to the access operation.

In the widely used self-refresh mode, with the lapse of the predetermined time after going into a CBR ($\overline{CAS}$ before $\overline{RAS}$) mode, sequential row addresses are internally generated until the CBR mode is completed and then word lines are activated, thereby refreshing data of the memory cells. FIG. 1 is a timing diagram showing an operation of such a self-refresh mode. Referring to FIG. 1, the memory device having N word lines and M bit lines performs the normal access mode according to row and column address signals X=0 Y=0, X=0 Y=1, X=0 Y=2, . . . X=N Y=M supplied externally. With the lapse of the predetermined time in the CBR mode, the normal access mode is converted to the self-refresh mode, thereby internally generating the sequential row addresses X=0, X=1, . . . X=N, so that the refresh operation of the memory cells is performed in the unit addressed by the word line. The memory cell requiring the longest time in completing the refresh operation in FIG. 1 will now be discussed. Assuming that time T1 is required in accessing data of all memory cells, the normal access mode is performed for nearly time T1 except that the memory cell designated by the last address defined as X=N Y=M, and thereafter the operation stand-by mode starts. Thereby, the self-refresh mode starts and then the refresh operation is performed for time T2 until internal row addresses of X=0, X=1, . . . X=N are generated. This indicates that the memory cell designated by the last address defined as X=N Y=M is refreshed with the lapse of time T1+T2. Accordingly, the refresh regulation time of the memory device having the timing diagram shown in FIG. 1 should be defined as time T1+T2 at least.

However, the memory device having the timing diagram shown in FIG. 1 has such a problem that the refresh regulation time becomes longer by time T1 than time T2 required in refreshing all memory cells. Since time T1 is generally set to be nearly equal to time T2, the refresh regulation time becomes twice as much as the necessary time.

In order to overcome the above problem, another conventional self-refresh method is shown in FIG. 2, which is capable of reducing the refresh regulation time by performing a burst refresh mode for a short time before and after the self-refresh mode. Referring to FIG. 2, after the normal access mode is performed for time T1, the burst refresh mode is performed in which the row address $\overline{RAS}$ is toggled at short intervals before going into the self-refresh mode, and thereby the word lines are sequentially activated for time T3 much shorter than time T1, so that all memory cells are refreshed. Thereafter, the normal self-refresh operation is performed for time T2. As $\overline{CAS}$ and $\overline{RAS}$ are disabled, the burst refresh mode is performed again after the self-refresh mode is completed, and then the normal access mode is performed. The refresh regulation time of the memory device having the refresh method shown in FIG. 2 is set to be the longer of T1+T3 or T2+T3. Since time T3 required in performing the burst refresh mode is set short enough to be ignored as compared to time T1 or T2, the refresh regulation time of this memory device can be defined as time T2 required in refreshing all memory cells. Thus, such a memory device has an advantage that the refresh regulation time can be shortened by half as compared to that of the memory device shown in FIG. 1.

However, in the method shown in FIG. 2, since $\overline{RAS}$ applied to the memory device should be toggled at short intervals in order to perform the burst refresh mode, the controller for driving the memory device must be able to perform the burst refresh mode.

SUMMARY OF THE INVENTION

It is therefore an object of the present invention to provide a self-refresh method and refresh control circuit of a semiconductor memory device, which can minimize a refresh regulation time.

It is another object of the present invention to provide the semiconductor memory device which has a function to internally perform a burst refresh mode before and/or after a self-refresh mode.

To accomplish the above objects, the present invention provides the self-refresh method and refresh control circuit, wherein the burst refresh mode is performed prior to the self-refresh mode. In the burst refresh mode, whether control signals applied from an external reach a predetermined condition or not is detected, and when a self-refresh starting signal is enabled, pulse rows of a short period are internally generated and then all word lines are sequentially activated, thereby performing the refresh of the memory cells.

In addition, the present invention provides the self-refresh method and refresh control circuit, wherein after the self-refresh mode is performed in response to the self-refresh starting signal, the burst refresh mode is performed when the self-refresh starting signal is disabled, and then a normal access mode is performed.

Furthermore, the present invention provides the self-refresh method and refresh control circuit, wherein when the self-refresh starting signal is enabled, the burst refresh mode is performed prior to the self-refresh mode, and when the enabled self-refresh starting signal is disabled, the burst refresh mode is performed again and then converted to the normal access mode. Accordingly, the memory device in which the burst refresh mode is performed by the refresh control circuit installed therein, can be embodied.

BRIEF DESCRIPTION OF THE DRAWINGS

The above objects and other advantages of the present invention will become more apparent by describing the preferred embodiment of the present invention with reference to the attached drawings, in which.

DETAILED DESCRIPTION OF THE PREFERRED EMBODIMENT

Figure 1:
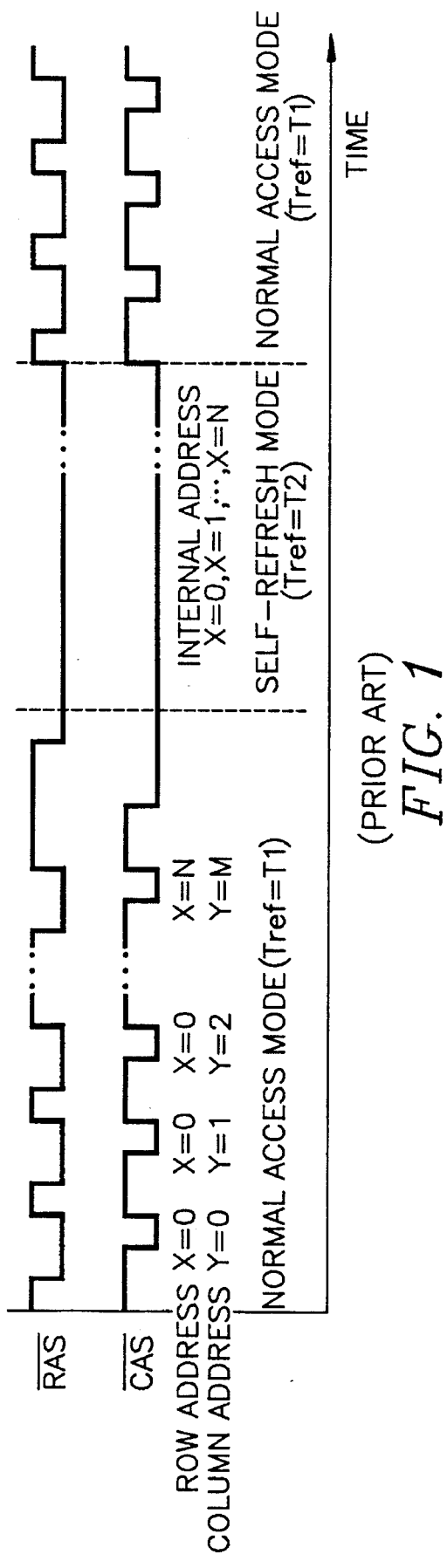
FIG. 1 is a timing diagram illustrating a conventional self-refresh mode.
Figure 2:
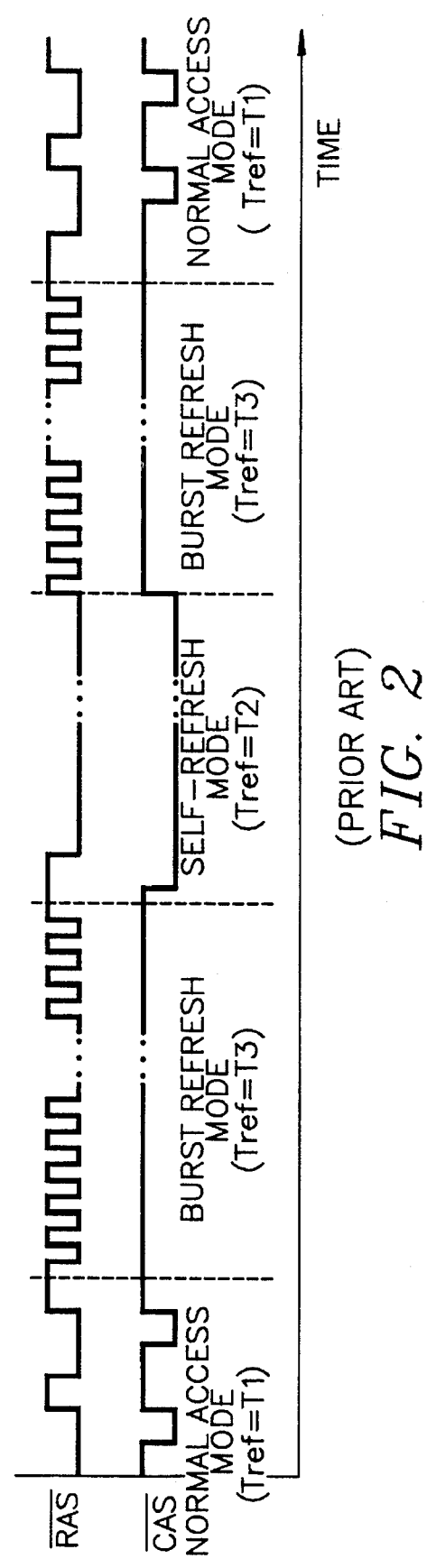
FIG. 2 is a timing diagram illustrating a conventional burst refresh mode.
Figure 3:
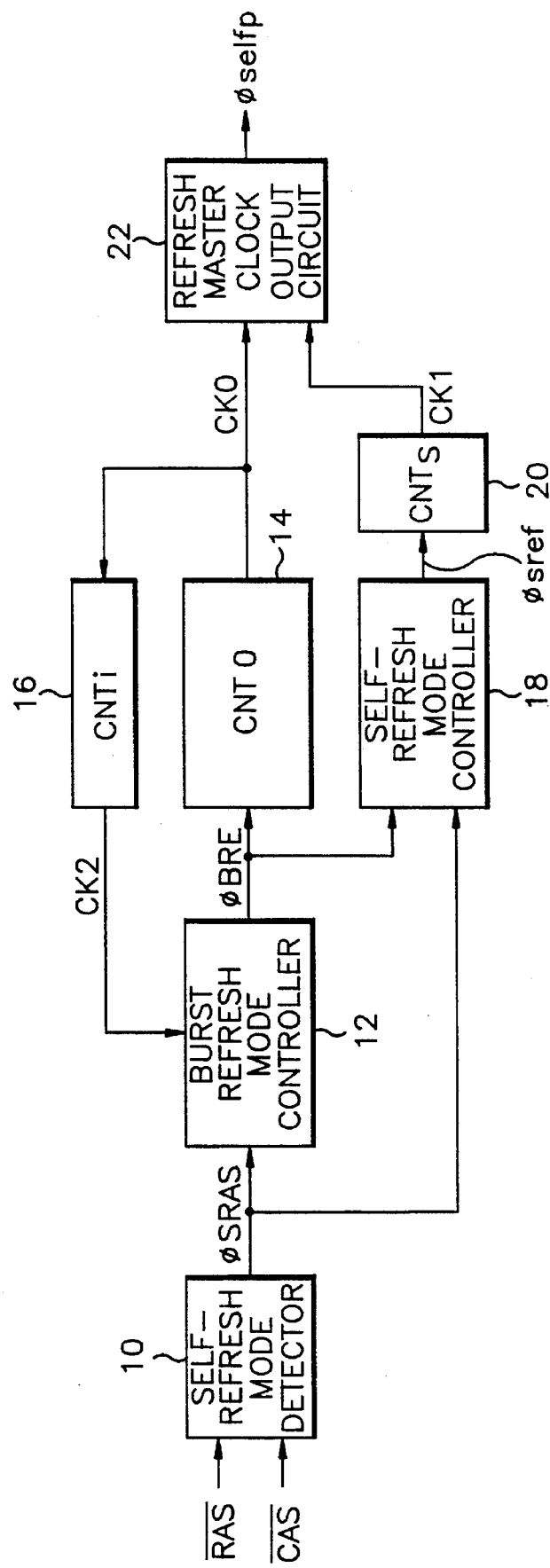
FIG. 3 is a diagram of one preferred embodiment according to the present invention, showing a refresh control circuit designed to perform the burst refresh mode before and after the self refresh mode.

FIG. 3 is a diagram illustrating one preferred embodiment according to the present invention, showing a refresh control circuit designed to perform a burst refresh mode before and after a self-refresh mode. The figure comprises a self-refresh mode detector 10 for receiving control signals $\overline{RAS}$ and $\overline{CAS}$ applied from an external source to a memory device and outputting a self-refresh starting signal φSRAS with the lapse of a predetermined time after going into a CBR mode; a burst refresh mode controller 12 for detecting a trigger point of the self-refresh starting signal φSRAS, i.e., the rising edge and falling edge of φSRAS and outputting a burst refresh control signal φBRE which is enabled to a logic high level; a counter CNT0 14 for outputting a continuous pulse row CK0 having a period of t1 in response to the enabled burst refresh control signal φBRE; a counter CNTi 16 for counting the pulse row CK0 outputted from the counter CNT0 14, and isolating the operation of the burst refresh mode controller 12 when a predetermined number of pulses are generated, thereby disabling the burst refresh control signal φBRE; a self-refresh mode controller 18 for detecting the point of time when the enabled burst refresh control signal φBRE is disabled at the enable state of the self-refresh approach signal φSRAS, to output a self-refresh control signal φsref; a counter CNTs 20 for outputting a continuous pulse row CK1 having the period of t2 in response to the enabled self-refresh control signal φsref; and a refresh master clock output circuit 22 for outputting one enabled pulse row of CK0 or CK1 to a master clock φselfp for selecting the word line.

Figure 4:
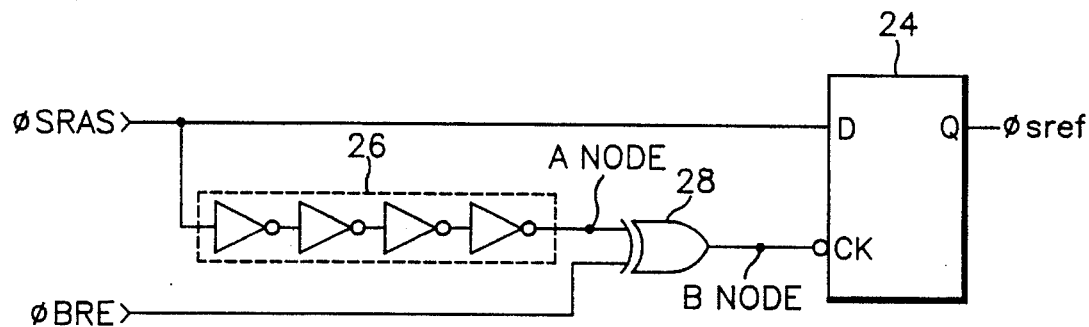
FIG. 4 is a detailed circuit diagram illustrating the self-refresh mode controller shown in FIG. 3.

FIG. 4 is a detailed circuit diagram illustrating the self-refresh mode controller 18 shown in FIG. 3. In FIG. 4, the starting signal φSRAS output from the self-refresh mode detector 10 is applied to an input terminal D of a D flip-flop 24, as well as to one input terminal of an XOR gate 28 via a signal delay circuit 26. The XOR gate 28 outputs the product obtained by exclusively ORing the delayed starting signal φSRAS and the burst refresh control signal φBRE to a clock terminal CK of the D flip-flop 24. The flip-flop 24 performs an input operation if a signal with a logic low level is applied to the clock terminal CK, thereby receiving the starting signal φSRAS applied to the input terminal D thereof. Also the flip-flop 24 performs an output operation if a signal with a logic high level is applied to the clock terminal CK, thereby outputting the self-refresh control signal φsref at a positive output terminal Q thereof.

Figure 5:
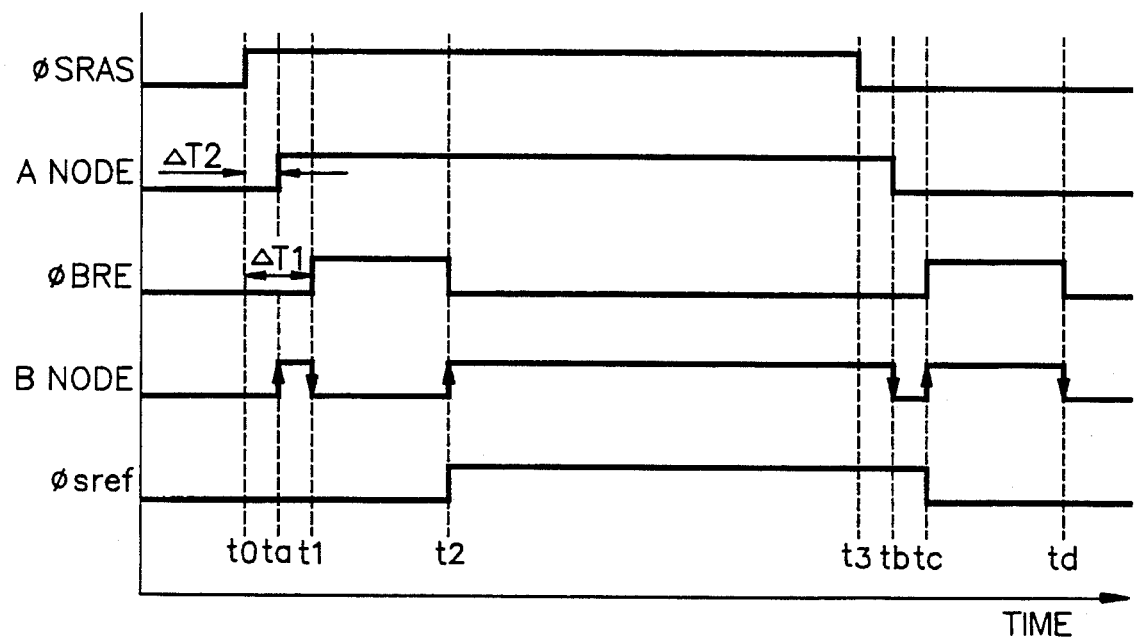
FIG. 5 is a timing diagram illustrating an operation of the self-refresh mode controller shown in FIG. 4.

FIG. 5 is a timing diagram illustrating the operation of the self-refresh mode controller 18 shown in FIG. 4. The points of time t0, t1, t2, t3 shown in FIG. 5 are the same as those in FIG. 6.

The operation of FIG. 4 will now be described in conjunction with FIG. 5. The starting signal φSRAS delayed by ΔT2 by the delay operation of the signal delay circuit 26 is applied to an output node A of the signal delay circuit 26. In order to prevent a logic malfunction, the delay time ΔT2 must be shorter than the delay time ΔT1 between φSRAS and φBRE. The output node B of the XOR gate 28 is changed to the logic high level at time ta delayed by ΔT2 from time t0 when the starting signal φSRAS is applied with the logic high level, so that the D flip-flop 24 performs the output operation. At this time, since the logic low level is latched in the D flip-flop 24, the self-refresh control signal φsref output from the positive output terminal Q is maintained at the logic low level. If the burst refresh control signal φBRE is enabled to the logic high level at time t1 delayed by ΔT1 from time t0, the output node B is changed to the logic low level, and the D flip-flop 24 is thereby converted to the input mode, to receive and latch the starting signal φSRAS therein. At time t2, as the enabled burst refresh control signal φBRE is disabled to the logic low level, the node B is again changed to the logic high level, and the D flip-flop 24 is thereby converted to the output mode, to output the latched logic high level signal at the positive output terminal Q thereof. At time tb delayed by ΔT2 from time t3 when the self-refresh starting signal φSRAS is changed to the logic low level, the node B is changed to the logic low level, and the D flip-flop 24 is thereby converted to the input mode, to receive and latch the starting signal φSRAS of the logic low level therein. Thereafter, at time tc delayed by ΔT1 after the self-refresh starting signal φSRAS is changed to the logic low level, as the disabled burst refresh control signal φBRE of the logic low level is enabled to the logic high level, the node B is changed again to the logic high level, the D flip-flop 24 is thereby converted to the output mode, to output the latched logic low level signal at the output terminal Q thereof. At time td when the burst refresh control signal φBRE is disabled to the logic low level, the node B is changed to the logic low level, the D flip-flop 24 is thereby converted to the input mode, to receive and latch the starting signal φSRAS of the logic low level therein. In accordance with the above described process, the D flip-flop 24 outputs the self-refresh control signal φsref shown in FIG. 5.

Figure 6:
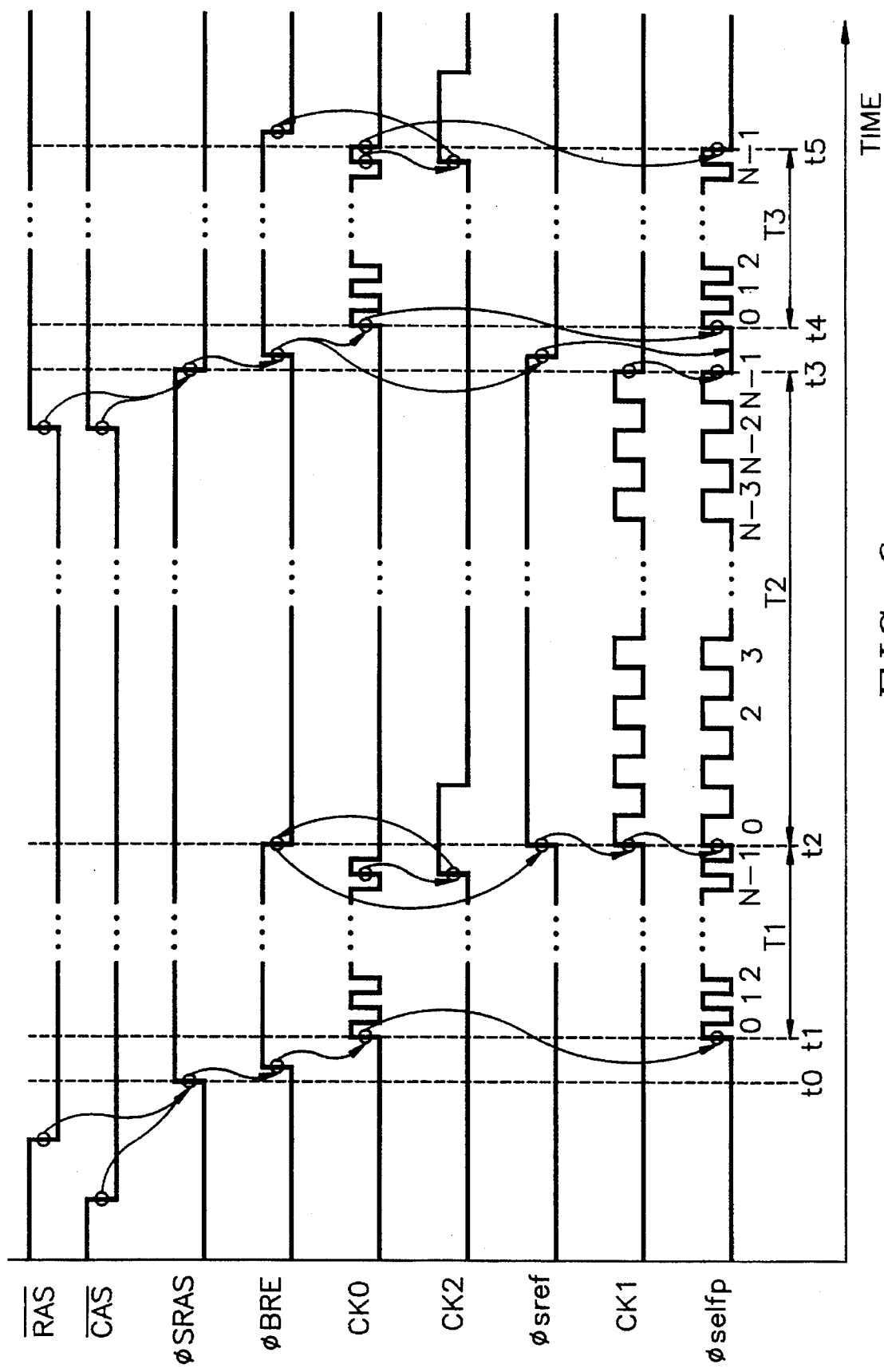
FIG. 6 is a timing diagram illustrating an operation of the refresh control circuit shown in FIG. 3.

FIG. 6 is a timing diagram illustrating the operation of the refresh control circuit shown in FIG. 3. The operation of FIG. 3 will now be discussed with reference to FIG. 6. In accordance with the essential technical spirit of the present invention, once going into the self-refresh mode, the refresh control circuit shown in FIG. 3 sequentially performs the burst refresh mode, the self-refresh mode, and then the burst refresh mode. During the interval T1 between time t1 and time t2, the burst refresh mode is performed prior to the self-refresh mode, during the interval T2 between time t2 and time t3, the self-refresh mode is performed, and during the interval T3 between time t4 and time t5, the burst refresh mode is performed immediately after completing the self-refresh mode.

Referring to FIG. 6, with the lapse of the predetermined time after going into the CBR mode, the self-refresh mode detector 10 outputs the self-refresh starting signal φSRAS which is enabled to the logic high level at time t0. As the self-refresh starting signal φSRAS is changed to the logic high level, the burst refresh mode controller 12 is activated, to output the burst refresh control signal φBRE of the logic high level. As the burst refresh control signal φBRE is enabled to the logic high level, the counter CNT0 14 outputs the first pulse row CK0 having a first period at time t1. The first pulse row CK0 is output as the master clock φselfp for sequentially driving the word lines via the master clock output circuit 22, thereby performing the burst refresh mode. It is well known to those skilled in the art that if the master clock φselfp is output, the memory device performs the restoring operation with sequentially enabling the word lines, to refresh the memory cells. At this time, the period of the master clock φselfp that controls the burst refresh mode is set to be relatively short as compared to that in the normal self-refresh mode. The counter CNTi 16 counts the pulse row CK0 output from the counter CNT0 14. Then, if the predetermined number (i.e. the number of all word lines) of pulses are generated, the counter CNTi 16 outputs the output signal CK2 of a narrow pulse width to the control terminal of the burst refresh mode controller 12. Thereby, the burst refresh control signal φBRE which has been applied with the logic high level from the burst refresh mode controller 12, is changed to the logic low level at time t2. This results in isolating the operation of the counter CNT0 14, to isolate the generation of the pulse row CK0, thereby completing the burst refresh mode to be performed before the self-refresh mode.

At time t2, as the burst refresh control signal φBRE is disabled to the logic low level, as shown in FIGS. 4 and 5, the self-refresh control signal φsref output from the self-refresh mode controller 18 is enabled to the logic high level and the counter CNTs 20 thereby outputs the second pulse row CK1 of the second period. The second pulse row CK1 is thus output as the master clock φselfp for sequentially driving the word lines via the refresh master clock output circuit 22, to perform the self-refresh mode. In this case, the master clock φselfp controlling the self-refresh mode has a similar period to that in the normal access mode. The self-refresh mode is continuously performed while the starting signal φSRAS is maintained at the logic high level. Thereby, all word lines are activated, and then sequentially activated again from the first word line.

As $\overline{RAS}$ and $\overline{CAS}$ are disabled to the logic high level in the self-refresh mode, the self-refresh starting signal φSRAS is disabled to the logic low level at time t3. Thus, the burst refresh mode controller 12 detects the falling edge of the self-refresh starting signal φSRAS, thereby enabling the burst refresh control signal φBRE to the logic high level. As described above, the counter CNT0 14 outputs the first pulse row CK0 having the first period and the first pulse row CK0 is output as the master clock φselfp via the refresh master clock output circuit 22, thereby performing the burst refresh mode. The process from the beginning of the burst refresh mode to the completion thereof is the same as described above. It is preferable to allow the memory cells corresponding to the word line selected last in the self-refresh mode to be sufficiently refreshed by delaying the burst refresh mode by the second period after performing the self-refresh mode and before beginning the burst refresh mode. In addition, it is possible to shorten the time required in performing the burst refresh mode by making the period of the master clock in the burst refresh mode relatively short as compared to that in the self-refresh mode.

According to one preferred embodiment shown in FIG. 3, once going into the self-refresh mode, the refresh control circuit installed within the memory device performs the burst refresh mode prior to the self-refresh mode, thereafter, performs the burst refresh mode again and then performs normal access mode. Thereby, the aforementioned problems can be solved.

Figure 7:
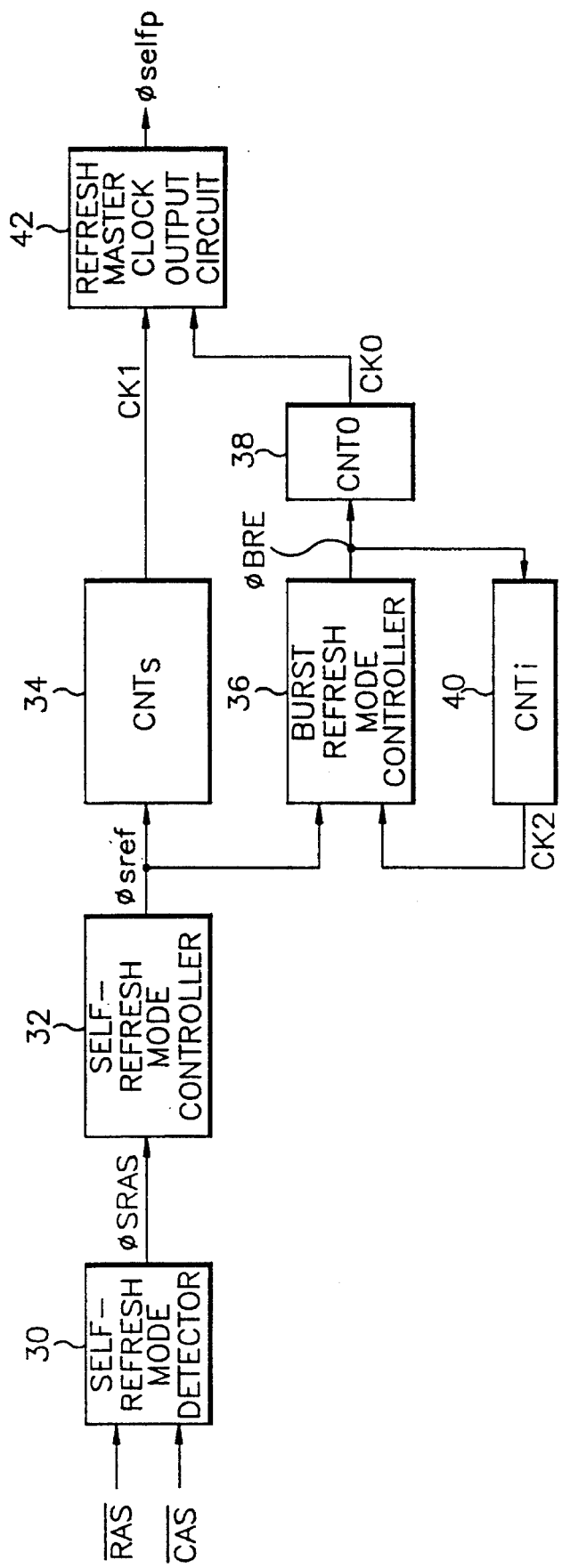
FIG. 7 is a diagram of another preferred embodiment according to the present invention, showing the refresh control circuit designed to perform the burst refresh mode at the completion of the self-refresh mode.
Figure 8:
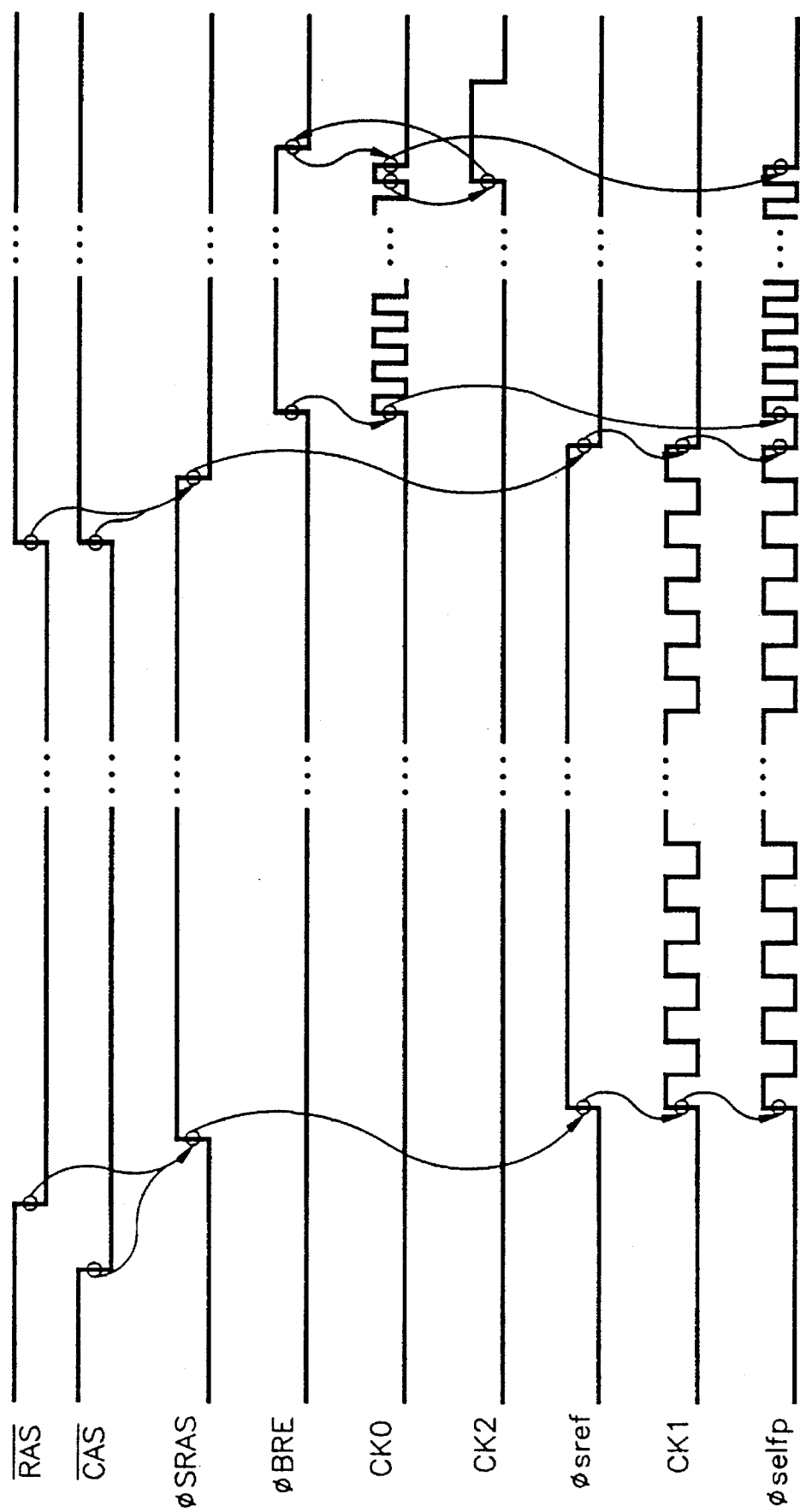
FIG. 8 is a timing diagram illustrating an operation of the refresh control circuit shown in FIG. 7.

FIG. 7 is a diagram of another preferred embodiment according to the present invention, showing the refresh control circuit designed to perform the burst refresh mode at the completion of the self refresh mode. FIG. 8 is a timing diagram illustrating the operation of the refresh control circuit shown in FIG. 7. FIG. 7 comprises a self-refresh mode detector 30 for receiving the control signals $\overline{RAS}$ and $\overline{CAS}$ applied from an external source to the memory device and outputting the self-refresh starting signal φSRAS with the lapse of the predetermined time after going into the CBR mode; a self-refresh mode controller 32 for detecting whether the self-refresh starting signal φSRAS is enabled or not, to output the self-refresh control signal φsref; a counter CNTs 34 for outputting the continuous pulse row CK1 having the period of time t2 in response to the enabled self-refresh control signal φserf; a burst refresh mode controller 36 for detecting the point of time when the self-refresh control signal φsref is disabled, to output the burst refresh control signal φBRE which is enabled to the logic high level; a counter CNT0 38 for outputting the continuous pulse row CK0 having the period of time t1 in response to the enabled burst refresh control signal φBRE; a counter CNTi 40 for counting the pulse row CK0 output from the counter CNT0 38, and isolating the operation of the burst refresh mode controller 36 when the predetermined number of pulses are generated, to disable the burst refresh control signal φBRE; and a refresh master clock output circuit 42 for outputting one enabled pulse row of CK0 or CK1 to the master clock φselfp for selecting the word line.

The operation of FIG. 7 will now be discussed with reference to FIG. 8. With the lapse of the predetermined time after going into the CBR mode, the self-refresh mode detector 30 outputs the self-refresh starting signal φSRAS of the logic high level, and the self-refresh control signal φsref output from the self-refresh mode controller 32 is thus enabled to the logic high level. The counter CNTs 34 outputs the pulse row CK1 having the period of time t2 and the pulse row CK1 is output as the master clock φselfp for sequentially driving the word lines via the refresh master clock output circuit 42, thereby performing the self-refresh mode. The self-refresh mode is continuously performed while the starting signal φSRAS is maintained at the logic high level. Thereby, all word lines are activated, and then sequentially activated again from the first word line.

If the control signals $\overline{RAS}$ and $\overline{CAS}$ are changed to the logic high level in order to go into the normal access mode, the self-refresh starting signal φSRAS is disabled to the logic low level and the self-refresh control signal φsref is thereby changed to the logic low level. At this time, the burst refresh mode controller 36 is activated to output the enabled burst refresh control signal φBRE at the logic high level. As the burst refresh control signal φBRE is enabled to the logic high level, the counter CNT0 38 outputs the pulse row CK0 having the period of time t1. The pulse row CK0 is output as the master clock φselfp for sequentially driving the word lines via the refresh master clock output circuit 42, thereby performing the burst refresh mode. The self-refresh and burst refresh modes will be readily understood by those skilled in the art with reference to the description of FIGS. 3 to 6.

According to another preferred embodiment of the present invention, the memory device can be provided in which the burst refresh mode is performed for a short time at the completion of the self-refresh and then is converted to the normal access mode.

As the third embodiment of the present invention, the method is also possible that after the self-refresh mode starts, the burst refresh mode is performed prior to the self-refresh mode and the self-refresh mode is converted to the normal access mode immediately after completing the self-refresh mode. Such an embodiment can be obtained by designing the burst refresh mode controller 12 of FIG. 3 to detect only the rising edge of the self-refresh starting signal φSRAS, to enable the burst refresh control signal φBRE.

In accordance with the present invention, it is possible to obtain the semiconductor memory device wherein after the self-refresh mode starts, the burst refresh mode is performed prior to the self-refresh mode; or the self-refresh mode is performed immediately after going into the self-refresh mode, and the burst refresh mode is performed at the completion of the self-refresh mode and then is converted to the normal access mode; or the burst refresh mode is performed before and after the self-refresh mode. Accordingly, it is possible to shorten the refresh regulation time and secure the stable refresh of the memory cells by utilizing the memory device according to the present invention.

What is claimed is:

1. A self-refresh method of a semiconductor memory device comprising steps of:

detecting whether control signals applied to said semiconductor memory device from a source external to said semiconductor memory device reach a predetermined condition or not, and if said predetermined condition is reached, generating a self-refresh control signal having an enabled state;

attempting to sequentially activate all memory cells of said semiconductor memory device during a first period of time, in response to said enabled state of said generated self-refresh control signal, to attempt a first refresh operation of said all memory cells of said semiconductor memory device; and attempting to sequentially activate said all memory cells, and during said same enabled state of said generated self-refresh control signal during a second period of time, to perform a second refresh operation of said all memory cells.

2. The self-refresh method of the semiconductor memory device according to claim 1, wherein:

said second period of time is equal to or greater than said first period of time.

3. A refresh control circuit of a semiconductor memory device, said refresh control circuit comprising:

a self-refresh mode detector for receiving a first control signal and a second control signal both supplied externally to said semiconductor memory device, said self-refresh mode detector outputting a self-refresh starting signal upon lapse of a predetermined period of time after going into a first mode;

a burst refresh mode controller for detecting at least one of a rising edge and a falling edge of said self-refresh starting signal being output by said self-refresh mode detector, and to output a burst refresh control signal in dependence on said self-refresh starting signal;

a first counter for outputting a continuous first pulse stream having a first counted period of time in response to said burst refresh control signal being output by said burst refresh mode controller;

a second counter for counting said continuous first pulse stream and then isolating an operation of said burst refresh mode controller when a predetermined number of pulses of said continuous first pulse stream are generated, and to disable said burst refresh control signal;

a self-refresh mode controller for detecting when said burst refresh control signal is disabled, and to output a self-refresh control signal when said self-refresh starting signal is being output by said self-refresh mode detector;

a third counter for outputting a continuous second pulse stream having a second counted period of time in response to said self-refresh control signal being output by said self-refresh mode controller; and a refresh master clock output circuit for outputting a refresh master clock output, corresponding to one of said continuous first pulse stream and said continuous second pulse stream, to a master clock for selecting word lines.

4. The refresh control circuit of the semiconductor memory device according to claim 3, wherein:

said second period of time is equal to or greater than said first period of time.

5. A self-refresh method of a semiconductor memory device comprising:

a first step of detecting whether control signals applied from an external reach a predetermined condition or not, to generate a self-refresh control signal;

a second step of sequentially activating all memory cells by a first period during an enable state of said self-refresh control signal, to perform a first refresh operation of said all memory cells; and a third step of sequentially activating said all memory cells by a second period of said same enable state of said self-refresh control signal in which said second step is performed, to perform a second refresh operation of said all memory cells.

6. The self-refresh method of the semiconductor memory device as claimed in claim 5, wherein said first period is equal to or greater than said second period.

7. The self-refresh method of the semiconductor memory device as claimed in claim 5, wherein:

said third step is delayed by at least said first period after said second step is completed, and then starts.

8. A refresh control circuit of a semiconductor memory device comprising:

a self-refresh mode detector for receiving control signals $\overline{RAS}$ and $\overline{CAS}$ applied externally to the memory device and outputting a self-refresh starting signal with the lapse of a predetermined time after going into a CBR mode;

a self-refresh mode controller for outputting a self-refresh control signal which is enabled during the enable state of said self-refresh starting signal;

a first counter for outputting a continuous first pulse stream having a first period in response to the enabled self-refresh control signal;

a burst refresh mode controller for detecting a point of time when said self-refresh starting signal is disabled, to output a burst refresh control signal;

a second counter for outputting a continuous second pulse stream having a second period in response to the enabled burst refresh control signal;

a third counter for counting said continuous second pulse stream, and then isolating an operation of said burst refresh mode controller when a predetermined number of pulses are generated, to disable said burst refresh control signal; and a refresh master clock output circuit for outputting a refresh master clock output, corresponding to one of said continuous first pulse stream and said continuous second pulse stream, to a master clock for selecting word lines.

9. The refresh control circuit of the semiconductor memory device as claimed in claim 8, wherein:

said first period is equal to or greater than said second period at least.

10. The refresh control circuit of the semiconductor memory device as claimed in claim 8, wherein:

said burst refresh mode controller is delayed by at least said first period after said self-refresh mode controller is disabled, and then is enabled.

11. A self-refresh method of a semiconductor memory device comprising steps of:

detecting whether control signals applied to said semiconductor memory device from a source external to said semiconductor memory device reach a predetermined condition or not, and if said predetermined condition is reached, generating a self-refresh control signal having an enabled state;

attempting to sequentially activate all memory cells of said semiconductor memory device during a first period of time, in response to said generated self-refresh control signal, to perform a first refresh operation;

sequentially activating said all memory cells during a second period of time during a same state of said generated self-refresh control signal in which said sequential activation of said all memory cells during said first period of time is performed, to perform a second refresh operation; and attempting to sequentially activate said all memory cells during a third period of time during the same state of said generated self-refresh control signal in which said sequential activation of said all memory cells during both said first period of time and said second period of time is performed, to perform a third refresh operation.

12. The self-refresh method of the semiconductor memory device according to claim 11, wherein:

said second period of time is equal to or greater than said first period of time.

13. The self-refresh method of the semiconductor memory device according to claim 11, wherein:

said step of sequentially activating said all memory cells during said third period of time is delayed by at least said second period of time after said step of sequentially activating said all memory cells during said second period of time.

14. A refresh control circuit of the semiconductor memory device, said refresh control circuit comprising:

a self-refresh mode detector for receiving a first control signal and a second control signal both supplied externally to said semiconductor memory device, said self-refresh mode detector outputting a self-refresh starting signal upon lapse of a predetermined period of time after going into a first mode;

a burst refresh mode controller for outputting burst refresh control signals at a rising edge and at a falling edge of said self-refresh starting signal, respectively;

a first counter for outputting a continuous first pulse stream having a first counted period of time in response to said burst refresh control signals being output by said burst refresh mode controller;

a second counter for counting said continuous first pulse stream, and then isolating an operation of said burst refresh mode controller when a predetermined number of pulses of said continuous first pulse stream are generated, and to disable said burst refresh control signals;

a self-refresh mode controller for detecting when said burst refresh control signals are disabled, and, when said self-refresh mode starting signal is being output by said self-refresh mode detector, to output a self-refresh control signal;

a third counter for outputting a second pulse stream having a second counted period of time in response to said self-refresh control signal being output by said self-refresh mode controller; and a refresh master clock output circuit for outputting a refresh master clock output, corresponding to one of said continuous first pulse stream and said second pulse stream, to a master clock for selecting word lines.

15. The refresh control circuit of the semiconductor memory device according to claim 14, wherein:

said second period of time is equal to or greater than said first period of time.

16. The refresh control circuit of the semiconductor memory device according to claim 14, wherein:

said burst refresh mode controller is delayed by at least said first counted period of time after said self-refresh mode controller is disabled, and then is enabled.

17. A refresh control circuit of a semiconductor memory device, said refresh control circuit comprising:

a self-refresh mode detector for receiving a first control signal and a second control signal both supplied externally to said semiconductor memory device, said self-refresh mode detector outputting a self-refresh starting signal upon lapse of a predetermined period of time after going into a first mode;

a burst refresh mode controller for detecting a condition of said self-refresh starting signal being output by said self-refresh mode detector, and to output a burst refresh control signal in dependence on said self-refresh starting signal;

a first counter for outputting a continuous first pulse stream having a first counted period of time in response to said burst refresh control signal being output by said burst refresh mode controller;

a second counter for disabling said burst refresh control signal;

a self-refresh mode controller for outputting a self-refresh control signal when said self-refresh starting signal is being output by said self-refresh mode detector;

a third counter for outputting a continuous second pulse stream having a second counted period of time in response to said self-refresh control signal being output by said self-refresh mode controller; and a refresh master clock output circuit for outputting a refresh master clock output, corresponding to one of said continuous first pulse stream and said continuous second pulse stream, to a master clock for selecting word lines.

18. The self-refresh method according to claim 1, wherein:

said second refresh operation of said all memory cells is a burst refresh operation.

19. The self-refresh method according to claim 5, wherein:

said second refresh operation of said all memory cells is a burst refresh operation.

20. The self-refresh method according to claim 11, wherein:

said first refresh operation and said third refresh operation are each a burst refresh operation.

* * * * *